United States Patent [19]

Croft

[11] Patent Number: 5,546,038
[45] Date of Patent: Aug. 13, 1996

[54] SCR INDUCTOR TRANSIENT CLAMP

[75] Inventor: Gregg D. Croft, Palm Bay, Fla.

[73] Assignee: Harris Corporation, Melbourne, Fla.

[21] Appl. No.: 497,124

[22] Filed: Jun. 30, 1995

[51] Int. Cl.⁶ ...................................................... H03K 5/08
[52] U.S. Cl. ........................... 327/310; 327/582; 361/111
[58] Field of Search ..................................... 327/309, 310, 327/313, 324, 327, 582; 361/100, 111

*Primary Examiner*—Timothy P. Callahan
*Assistant Examiner*—Jeffrey Zweizig
*Attorney, Agent, or Firm*—Frederick R. Jorgenson

[57] ABSTRACT

A monolithic voltage clamp provides low impedance, low voltage electrostatic discharge protection for an integrated circuit without affecting the integrated circuit's DC characteristics. First, second, third, and fourth regions of semiconducting material are formed with p-n junctions between each region. A first inductor electrically connects the first and second regions, and a second inductor electrically connects the third and fourth regions. The first and second inductors should each have an inductance which is large enough to delay an increase in bypass current around their respective p-n junctions for a period which is long enough to assure that conduction is sufficient to discharge an electrostatic pulse. In a preferred embodiment, first and second reverse bias diodes are used to electrically connect the invention to one or more input/output nodes. In another embodiment, an integrated circuit having first and second potential inputs, and a plurality of input/output nodes, may be provided with a transient clamp according to the invention. Along with the first and second reverse bias diodes used to connect the invention to one or more input/output nodes, third, fourth, fifth, and sixth reverse bias diodes may be used to electrically connect the first and second potential inputs to respective first and fourth semiconducting regions. In this configuration, an input/output node can operate at voltages above and below supply voltages provided to the first and second potential inputs, limited only by the breakdown voltages of the third and fourth reverse bias diodes.

15 Claims, 4 Drawing Sheets

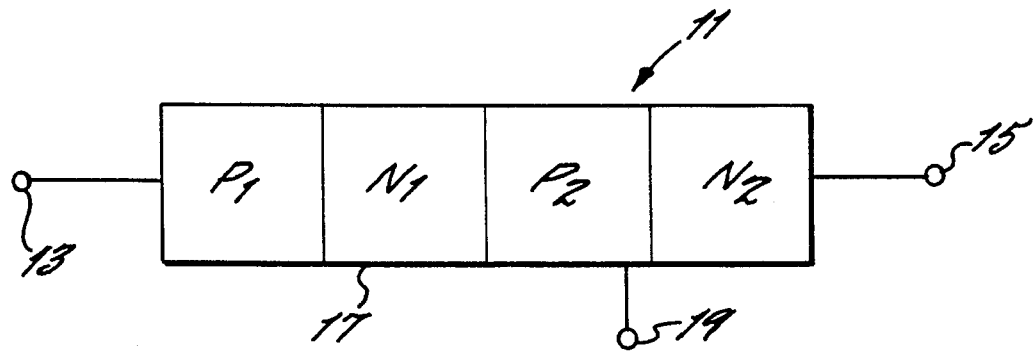
PRIOR ART
Fig. 1A.
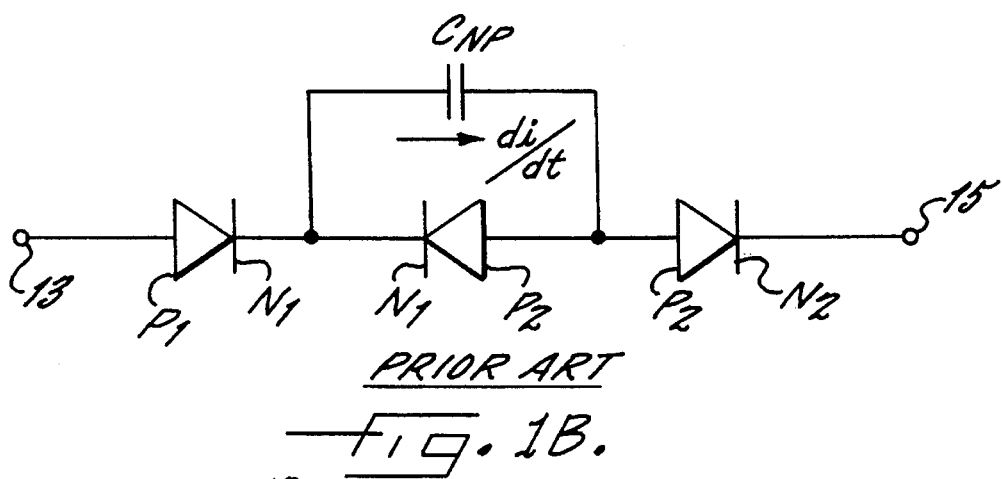
PRIOR ART
Fig. 1B.
PRIOR ART
Fig. 1C.

5,546,038

SCR INDUCTOR TRANSIENT CLAMP

FIELD OF THE INVENTION

This invention relates to electrostatic discharge (ESD) protection for integrated circuits (ICs). More particularly, this invention relates to circuits which can discharge, or clamp, transient electrostatic discharges.

BACKGROUND OF THE INVENTION

An electrostatic charge is an electric charge which is stored on the surface of an insulated object. The process for charging the human body, for example, is known as triboelectrification—which occurs when an insulator and another material become charged by contact and separation, such as sliding. Shoe soles can become charged as the result of contact and separation with another insulating surface, such as carpet. The surface of clothes can become charged by contact and separation with seat coverings. Thus, a human body is initially uncharged. It is the presence of multiple charged sources located close to the body, such as footwear and clothing, that are responsible for the buildup of an electrostatic charge. The human body acts as a neutral conductor to transmit these charges, which are on the order of $1 \times 10^{-6}$ C, to other bodies which may be either electrically grounded or at a floating potential. An ESD event occurs when a built up electrostatic charge is transmitted by one's touch, as the two bodies reach the same potential.

Electrostatic discharges, as described above, can damage and cause the failure of electronic components. For example, MOS devices are extremely susceptible to ESD damage because of their inherently high input impedances. Some submicron gate oxides can be ruptured by an electrostatic charge of between about 10–20 V, which can be easily built up via triboelectrification. Therefore, ESD protection of ICs is quite important.

Generally, electrostatic discharge protection is applied to the input/output (I/O) pins of an IC. One typical method of protecting an IC from ESD events is to connect each and every I/O pin to positive and negative supplies by reverse bias diodes. When an ESD event occurs, the diodes protect the IC from damage by providing low impedance discharge paths around sensitive internal circuitry of the IC for ESD pulses. However, when a transient electrostatic discharge occurs, these diodes may appear to the charge as either forward or reversed biased. As is well known, reverse bias diodes provide higher voltage discharge paths for an electrostatic discharge than forward biased diodes. In fact, power dissipated in a reverse bias diode due to an ESD event may be more than an order of magnitude greater than the power dissipated in the same diode when forward biased. Another unfortunate factor with reverse bias diodes is that they require larger junction areas than forward biased diodes. Large area protection diodes on I/O pins contribute unwanted parasitics, i.e., larger capacitances and leakage currents, which, in turn, degrade AC performance.

Clamping circuits have also been used in connection with electrostatic discharge paths through diodes. A supply clamp is typically connected across the power supply and limits the maximum differential voltage that can be applied between those two pins. Supply clamps are designed to act as voltage limiters by conducting large amounts of current when some predetermined maximum differential voltage, also known as a clamp voltage, is exceeded. A clamp provides a conduction path at a voltage higher than the power supply but lower than the breakdown voltage of the reverse biased I/O protection diodes, thereby reducing the reverse bias diode junction size requirement by reducing the power dissipation requirement.

While the addition of a clamp provides a greater level of electrostatic discharge protection, the clamp voltage is still set higher than the supply voltage. Therefore, the conduction voltage of all the ESD discharge paths through the supply clamp will be higher than the normal supply voltage. Accordingly, electrostatic discharge protection using I/O protection diodes with or without clamping cannot, in its standard form, provide voltage protection which is less than a normal supply voltage. For another example of an ESD protection device, see Ming-Dour Ker and Chung-Yu Wu, CMOS *On-Chip Electrostatic Discharge Protection Circuit Using Four SCR Structures with Low ESD Trigger Voltage,* Solid Stage Electronics, Vol. 37, No. 1, pp 17–26 (1994). Another ESD protector is disclosed in U.S. patent application Ser. No. 08/198,002, entitled "*ESD Protection Using SCR Clamping*" which was filed Feb. 17, 1994 and which is assigned to the assignee of the present invention. The '002 application describes an ESD protection device which may be clamped at a voltage level lower than a supply voltage. In this way, the invention can protect components which might otherwise be damaged by electrostatic discharges which are less than the voltage supply. However, the '002 invention disables some of its ESD protection when the IC is mounted on a printed circuit board. The invention also uses at least two additional dedicated pins on the IC.

SUMMARY OF THE INVENTION

It is therefore an object of the present invention to provide an electrostatic discharge protection device which can clamp voltages which are lower than a supply voltage and which protects integrated circuits from ESD events while mounted on a printed circuit board.

It is a further object of the present invention to provide an ESD protection device which does not require an IC to add dedicated pins to utilize the ESD protection device.

These and other objects according to the present invention are provided by a monolithic voltage clamp which allows low impedance, low voltage electrostatic discharge protection for an integrated circuit, without affecting the integrated circuit's DC characteristics. More particularly, the invention comprises first, second, third, and fourth regions of semiconducting material. The first and third regions are of a first type of conductivity, and the second and fourth regions are of a second type of conductivity. Accordingly, p-n junctions are formed between the first and second regions, the second and third regions, and the third and fourth regions. A first inductor electrically connects the first and second regions, and a second inductor electrically connects the third and fourth regions.

The first inductor should have an inductance which is large enough to delay an increase in bypass current around the p-n junction between the first and second regions for a period which is long enough to assure that conduction is sufficient to discharge an electrostatic discharge. Similarly, the second inductor should have an inductance which is large enough to delay an increase in bypass current around the p-n junction between the third and fourth regions for a period which is long enough to assure that conduction is sufficient to discharge an electrostatic discharge. In one embodiment, the invention may be tuned for particular types of electrostatic discharge events. For example, the first and second inductors may have inductance values between about 20 nH to 50 nH.

In a preferred embodiment, first and second reverse bias diodes are used to electrically connect the invention to one or more input/output nodes. A first reverse bias diode may be used to electrically connect an input/output node and the first region, and a second reverse bias diode may be used to electrically connect the input/output node to the fourth region. In some instances, it may be desirable to connect a substrate resistor in parallel to one of the first and second inductors. In this case, the resistance of the substrate resistor should be maintained high enough to allow the voltage clamp to latch.

In another preferred embodiment, an integrated circuit having first and second potential inputs, and a plurality of input/output nodes, may be provided with an SCR transient clamp according to the invention. An SCR clamp according to the invention has first, second, third, and fourth regions of semiconducting material, as described above, along with the first inductor connecting the first and second regions and the second inductor connecting the third and fourth regions. The first pair of reverse bias diodes are again used, one connecting at lease one input/output node to the first region and the other connecting the at least one input/output node to the fourth region. In addition, third and fourth reverse bias diodes may be used to electrically connect the first and second potential inputs to respective first and fourth semiconducting regions. In this configuration, an input/output node can operate at voltages above and below supply voltages provided to the first and second potential inputs, limited only by the breakdown voltages of the third and fourth reverse bias diodes.

BRIEF DESCRIPTION OF THE DRAWINGS

FIG. 1A illustrates a block diagram of an SCR.

FIG. 1B illustrates a diode equivalent circuit of the p-n junctions formed by the SCR of FIG. 1A.

FIG. 1C illustrates a bi-polar transistor equivalent circuit of the p-n junctions formed by the SCR shown in FIGS. 1A and 1B.

DESCRIPTION OF THE PREFERRED EMBODIMENTS

Figure 2:
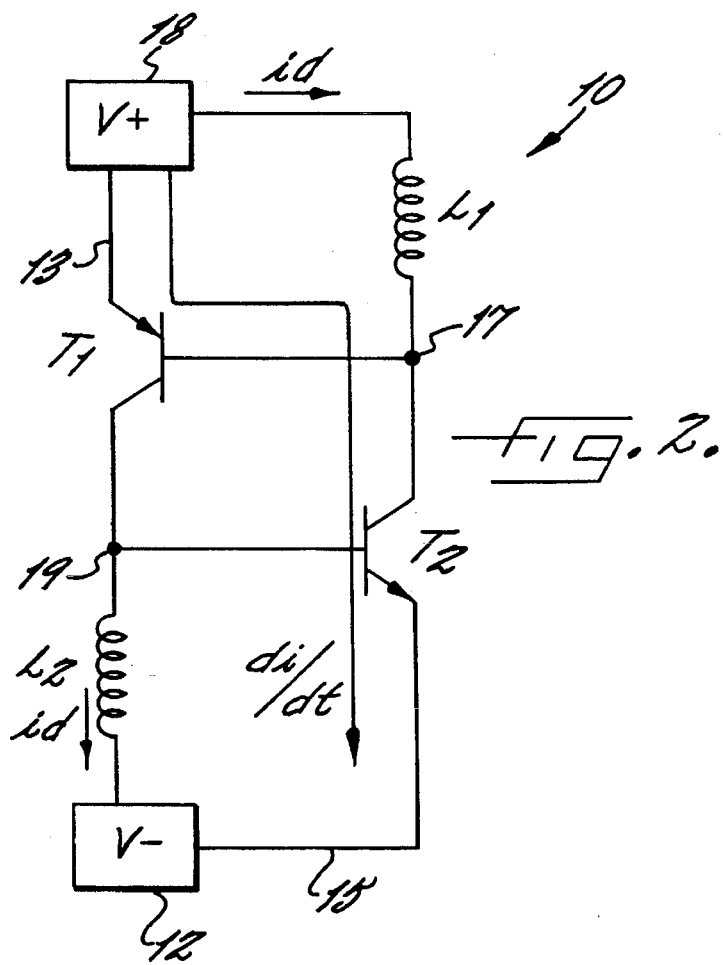
FIG. 2 illustrates an ESD clamp according to the invention connected between power supply pins or I/O pins.

The present invention now will be described more fully with reference to the accompanying drawings, in which the preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

Referring now to FIG. 1A, an SCR, generally referred to by numeral 11, has three electrodes, an anode 13, a cathode 15, and a control electrode, which is shown in the figure as cathode gate 19. The SCR 11 is a four-layer PNPN structure, as shown in FIG. 1A, that is a bi-stable device which can switch between a high impedance, low current off-state and a low impedance, high current on-state. The device 11 will block forward voltage until an appropriate current pulse is applied to the gate 19. Thereafter, the device 11 continues to conduct as long as forward current flows. The intensity and shape of current through the SCR 11 are determined by the supply voltage, the load, and the circuit configuration. The gate 19 cannot interrupt forward current. Instead, the SCR 11 turns off automatically when the circuit conditions mandate current flow in the reverse direction, and then it blocks voltage in the reverse and (without a gate signal) forward directions.

When an SCR 11 is reverse-biased, anode 13 negative with respect to cathode 15, the SCR 11 exhibits a very high internal impedance, and only a very low reverse current flows through the device. This current remains small until the reverse voltage exceeds the reverse breakdown voltage, where the current increases rapidly. When an SCR 11 is forward biased, anode 13 positive with respect to cathode 15, the PNPN structure is electrically bi-stable and may exhibit either a very high impedance (off-state) or a very low impedance (on-state). In the off-state, a small forward current, or leakage current, flows through the device. As the forward bias is increased, a voltage is reached at which the forward current increases rapidly, and the SCR 11 switches to the on-state. This voltage is called the forward breakover voltage. The SCR 11 will remain in the on-state until the current decreases below a "holding" current, where the SCR 11 reverts back to an off-state. The breakover voltage of an SCR 11 can be varied or controlled by injection of a signal at the gate 19. As the gate current is increased, the breakover, or blocking, voltage becomes lower until the device 11 switches to an on-state. This enables the SCR 11 to control a high power load with a very low power signal. With zero gate current, the forward characteristic in the off-state is determined by the center $N_1$-$P_2$ junction, which is reverse biased.

Referring again to FIG. 1A, region $P_1$ is identified as the anode 13, region $N_1$ as the anode gate 17, region $P_2$ as the cathode gate 19, and region $N_2$ as the cathode 15. As would be known to those skilled in the art, and illustrated in FIG. 1B, the anode gate 17 to cathode gate 19 junction ($N_1$-$P_2$ junction) has an associated finite junction capacitance, $C_{np}$, which is back biased with regard to the forward biased $P_1$-$N_1$ and $P_2$-$N_2$ junctions. A voltage changing in time that appears across the junction capacitance $C_{np}$ will cause a current proportional to that capacitance and the voltage signal. Accordingly, an electrostatic voltage appearing across terminals 13 and 15 will produce a transient current di/dt through capacitor $C_{np}$ and a leakage current $I_L$ from the anode 13 to cathode 15. Both of these currents flow from the anode gate 17 to the cathode gate 19 and, when large enough, they will turn the SCR 11 on and cause it to latch. As shown in schematic form by FIG. 1C, bipolar transistors $T_1$ and $T_2$ may be used to illustrate the function of the SCR. To reduce an SCR's latch up potential, the anode gate 17 may be shorted by electrical connection 21 to the anode 13, and the cathode gate 19 may be shorted by electrical connection 23 to the cathode 15, as shown by the dashed lines The invention, illustrated in FIG. 2, is a transient clamp network 10 which uses two inductors $L_1$, $L_2$ to electrically connect the anode gate 17 and the anode 13, and the cathode gate 19 and the cathode 15. The inductors $L_1$, $L_2$ permit varying amounts of bypass current to flow both from the anode 13 to the anode gate 17 and from the cathode 15 to the cathode gate 19. This bypass current drains away potential base current from both the forward biased anode 13 to anode gate 17 junction and cathode gate 19 to cathode 15 junction. During a transient event, this bypass current will be very small, allowing base current to flow through the forward biased junctions—causing SCR 11 to latch. However, as this bypass current through the inductors $L_1$, $L_2$ increases with time, the current through the forward biased junctions will decrease, causing the SCR 11 to turn off, or unlatch, and cease conducting. The clamp 10 may be connected, for example, between a positive power supply terminal 18 and negative power supply terminal 12. Accordingly, anode 13 is electrically connected to positive power supply terminal 18 and the cathode 15 is electrically connected to negative power supply terminal 12. The anode gate 17 is connected to the same terminal 18 as the anode 13, through inductor $L_1$, and the cathode gate 19 is connected to the same terminal 12 as the cathode 15 through inductor $L_2$.

In operation, transient clamp 10 acts as a low impedance, low voltage clamp when a positive transient dv/dt signal is applied from terminal 18 to terminal 12. A positive electrostatic discharge dv/dt signal appearing on terminal 18 will forward bias the emitter base junctions of transistors $T_1$ and $T_2$. The majority of this electrostatic discharge signal will appear across the reverse biased anode gate 17 to cathode gate 19 junction, shown in FIG. 1C as the $N_1$-$P_2$ junction. The $N_1$-$P_2$ junction forms the base collector junctions of both $T_1$ and $T_2$. The anode 13 to anode gate 17 junction ($P_1$-$N_1$) and the cathode 15 to cathode gate 19 junctions ($N_2$-$P_2$) will be forward biased.

A voltage dv/dt across junction capacitor $C_{np}$ will generate a transient current di/dt which will flow from the anode gate 17 to the cathode gate 19. Since the current through an inductor cannot change instantaneously, this di/dt current initially will not be able to flow through either $L_1$ or $L_2$. Rather, the inductors $L_1$ and $L_2$ represent an open circuit. Therefore, the initial transient current di/dt flows out of the base of $T_1$ into the base of $T_2$, shown as the $N_1$-$P_2$ junction. This current acts as gate current for both the anode gate 17 and cathode gate 19 of the SCR 11 and triggers the SCR 11 into latch-up when sufficiently large. The SCR 11 in a latch-up condition presents a low impedance discharge path for electrostatic potential between terminals 18 and 12. However, the inductors $L_1$, $L_2$ will eventually begin to conduct and draw base current away from the $N_1$ base junction of $T_1$ and $P_2$ base junction of $T_2$. As this bypass current through the inductors $L_1$, $L_2$ increases, the SCR 11 will unlatch and revert into a non-conducting condition when the inductors $L_1$, $L_2$ drain away enough base current to drive the effective npn/pnp beta product below unity.

For direct current (DC) or slowly changing transient voltages, the transient clamp 11 will appear as a reverse bias diode. In other words, the inductors $L_1$, $L_2$ initially allow the transient gate current to cause the SCR 11 to latch and then later drain the gate current away from the SCR 11 causing it to unlatch or turn off. The SCR 11 conducts transient currents in response to transient electrostatic charges, appearing as a dv/dt signal. However, where the electrostatic charge approaches a direct current, the SCR will appear as a high impedance reverse bias diode. Stated differently, the invention behaves like a low impedance, low voltage clamp when a very rapid dv/dt signal is applied across its terminals, and as a high impedance if the voltage signal changes relatively slowly with time, such as a DC signal. This behavior is similar to that of a capacitor passing high frequency signals and blocking low frequency signals.

Figure 6:
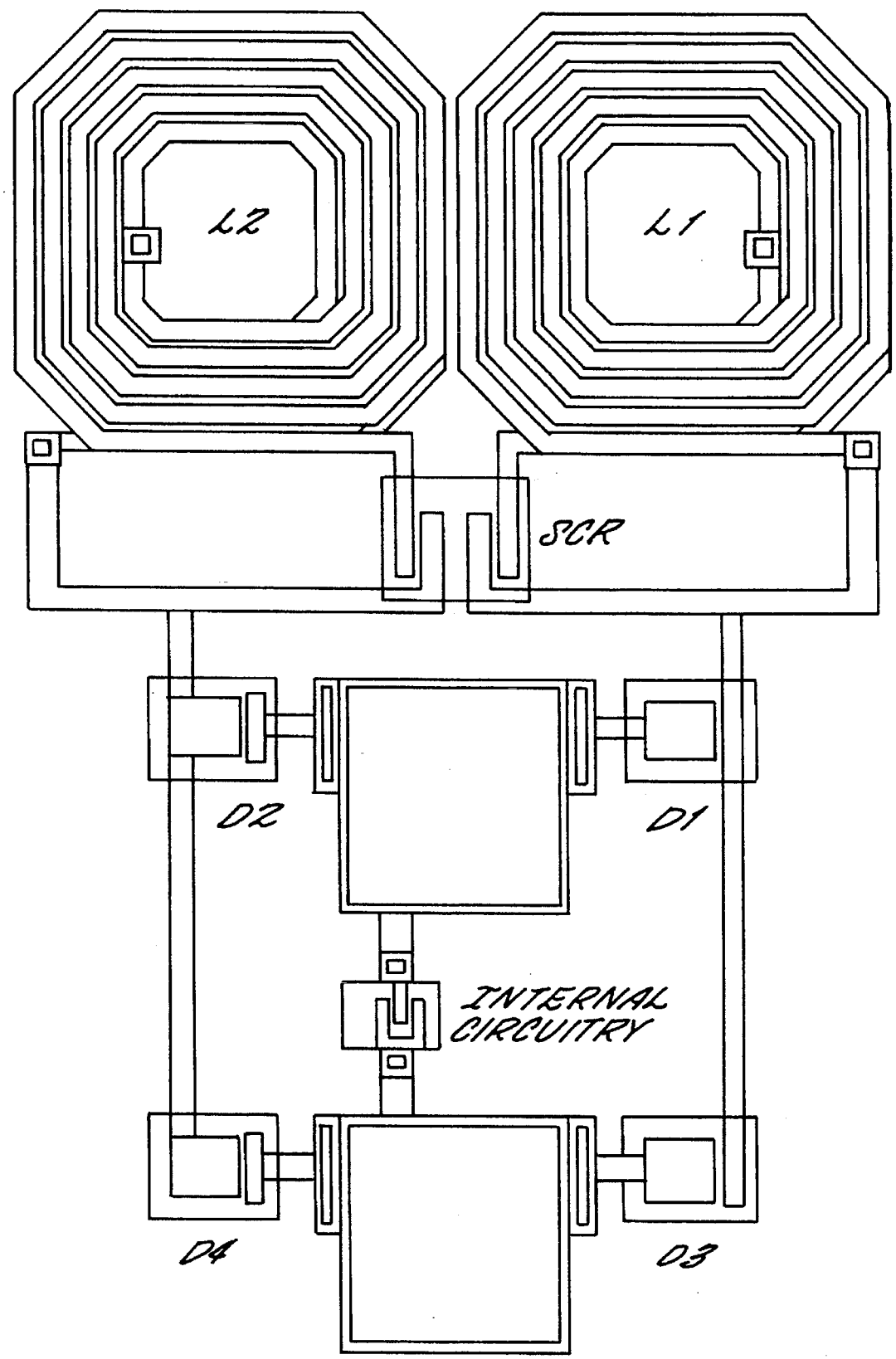
FIG. 6 illustrates an integrated circuit layout of the invention shown in FIG. 3.

The most damaging of the transient electrostatic discharges have voltage signals with rapid rise times, as compared to the voltage signals which represent normal operation for the protected integrated circuit. Significantly, the transient clamp 10 may be tuned to differentiate between a rapid voltage signal dv/dt due to an ESD event and a slower dv/dt signal associated with normal IC operation. This tuning can be achieved by adjusting the values of the inductors $L_1$, $L_2$ between the anode 13 and anode gate 17 and cathode 15 and cathode gate 19 to a specific time constant for the best operation. The respective inductance values should be large enough to delay the increase in the bypass current around the respect forward biased P-N junctions for a period which is long enough to assure that conduction is sufficient to discharge an electrostatic discharge across the transient clamp 10. In this way, the transient clamp 10 can provide low impedance, low voltage discharge paths to electrostatic discharge pulses while not affecting the normal operation of an integrated circuit. Initial Pspice circuit simulations have indicated that $L_1$ and $L_2$ should be in the range of 20–50 nH with less than 20 ohms of series resistance in order to tune an SCR supply clamp for discharging typical ESD pulses. One method of achieving this large amount of inductance with a low series resistance on an integrated circuit is to use 2-layer spiral metal inductors. FIG. 6 illustrates an IC layout using spiral metal inductors $L_1'$ and $L_2'$.

Figure 3:
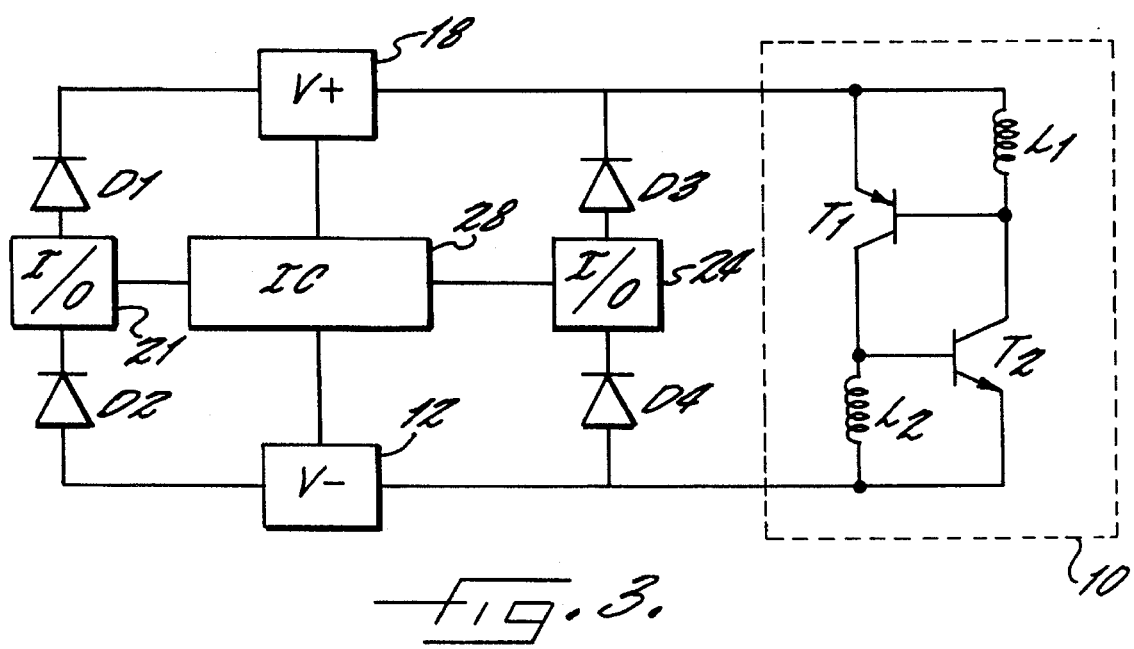
FIG. 3 illustrates a second embodiment of an ESD clamp according to the invention connected between power supply pins or I/O pins through reversed biased diodes.

FIG. 3 illustrates the transient clamp 10 in a second embodiment which is connected to protect an integrated circuit portion 28 from electrostatic discharge events. As shown, the transient clamp 10 is connected directly across the power supply terminals 18, 12 to protect the integrated circuit's I/O terminals 21, 24 through reverse biased diodes D1, D2, D3 and D4. In operation, an electrostatic discharge potential would cause a current di/dt to flow within the transient clamp 10, as shown in FIG. 3, from the anode 13 to the cathode 15 to provide a low impedance path discharging any electrostatic potential between supply terminals 18 and 12. Any potential appearing between the I/O terminals 21, 24 would similarly be discharged through the diode paths. For example, a positive electrostatic potential on I/O pin 21 with respect to I/O pin 24 would be discharged through diode D1, the positive power supply terminal 18, the transient clamp 10, negative power supply terminal 12, through diode D4 to I/O pin 24. A positive electrostatic potential on I/O pin 24, with respect to I/O pin 21, would be discharged through diode D3, positive supply terminal 18, transient clamp 10, negative power supply terminal 12 and diode D2, to I/O pin 21.

Figure 4:
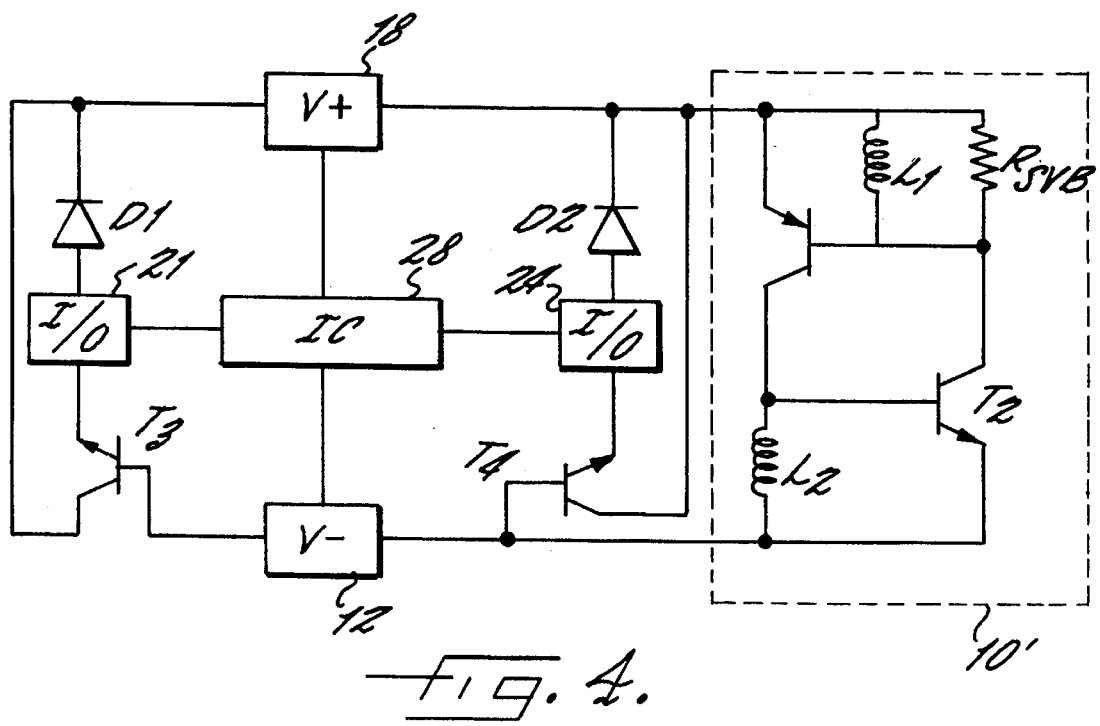
FIG. 4 illustrates a third embodiment of an ESD clamp according to the invention in a P-well implementation with bipolar transistors.

The transient clamp 10 can be implemented in different semiconductor processes, such as the CMOS P/well process or an N/well implant process. FIG. 4 illustrates a third embodiment of the invention, the transient clamp 10 of FIG. 3 is illustrated in a standard non-isolated CMOS P/well implementation. A similar N/well implementation is also possible, but is not shown. In either the P/well or N/well implementation, a substrate resistor $R_{sub}$ may be used in parallel with one of the two inductors $L_1$ or $L_2$. The substrate resistor $R_{sub}$ should be high enough in value so as to allow latching of the transient clamp 10'. If the substrate resistance $R_{sub}$ is too low, it may prevent the transient clamp 10' from latching during an ESD event by providing a low resistance current path around a forward biased P-N junction. If the value of $R_{sub}$ is high enough, then it will have little effect on the operation of the transient clamp 10'. Although complex modeling is required for precise calculation, as a rough rule of thumb, the substrate resistance value will vary depending on the Beta values of the transistors $T_1$, $T_2$. If a typical Beta value for a PNP transistor is 50, and a typical Beta value of a NPN transistor is 100, then $R_{sub}$ should be at least about 10 ohms. In non-CMOS processes with adequate dielectric isolation, such as silicon-on-sapphire, a substrate resistor is not necessary.

Transistors $T_3$ and $T_4$ provide additional electrostatic discharge protection by supplying an additional discharge path in parallel with the transient path through the transient clamp 10'. For example, as shown in FIG. 4, conduction of ESD discharge current through the transient clamp 10' forward biases the base-to-emitter junctions of $T_3$ and $T_4$ causing collector current to flow from the positive voltage supply 18 to I/O pins 21, 24. Essentially, transistors $T_3$ and $T_4$ provide discharge paths from the positive power supply terminal 18 to I/O pins 21, 24 when they receive a base current upon latch up of the transient clamp 10'. The base current to $T_3$ and $T_4$ causes collector current of $T_3$ and $T_4$ to flow and provides additional discharge paths between the positive power supply terminal 18 and the I/O pins 21, 24.

Figure 5:
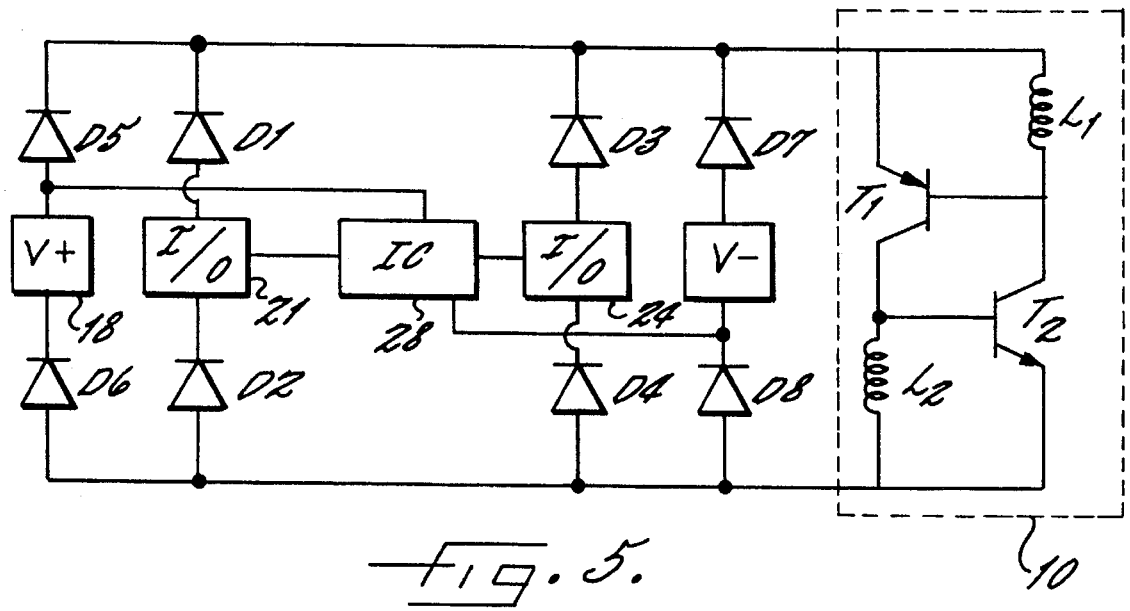
FIG. 5 illustrates a fourth embodiment of an ESD clamp according to the invention which allows I/O pins to function at voltages outside a normal supply range.

FIG. 5 corresponds to the schematic shown in FIG. 3 where the transient clamp 10 is used in connection with the power supply terminals 18, 12 and I/O terminals 21, 24. In FIG. 5, however, the transient clamp 10 is no longer placed directly across the supply terminals 18, 12. Instead, the supply terminals 12, 18 are electrically connected, like the I/O pins 21, 24, through reverse bias diodes D5–D8. Thus, low impedance transient ESD discharge paths exist between all of the various pin combinations. This configuration allows the I/O pins 21, 24 to operate at voltages above the positive supply voltage and below the negative supply voltage without the signal being clamped by a forward biased diode in the ESD protection network.

In FIGS. 2, 3, and 4, the transient clamp 10 is responsive to a positive electrostatic potential appearing on the positive power terminal 18 with reference to the negative power supply terminal 12. In the embodiments shown in FIGS. 3 and 4, the transient clamp 10 is responsive, for example, to a positive potential appearing on one I/O pin 21 with respect to another I/O pin 24. The clamp 10 is responsive to other pin combination as well, i.e., I/O pin 21 to negative supply terminal 12. In the case of FIG. 5, the transient clamp 10 will be responsive to a positive potential appearing on any of the power supply pins 12, 18 or the I/O pins 21, 24, with respect to any other power supply pin or I/O pin, not shown.

In the drawings and specification there have been disclosed typical preferred embodiments of the invention. Although specific terms are employed, they are used in a generic and descriptive sense only and not for purposes of limitation. For example, although the only four layer PNPN device described with the invention is SCR 11, the invention could be used with other four layer PNPN devices, such as thyristors, etc. The scope of the invention is set forth in the following claims.

That which is claimed:
1. A monolithic voltage clamp comprising:
   first, second, third, and fourth regions of semiconducting material, said first and third regions being of a first type conductivity and said second and fourth regions being of a second type conductivity, such that p-n junctions are formed between said first and second regions, said second and third regions, and said third and fourth regions;
   a first inductor electrically connecting said first and second regions; and
   a second inductor electrically connecting said third and fourth regions.

2. A voltage clamp according to claim 1 wherein said first inductor has an inductance which is large enough to delay an increase in bypass current around the p-n junction between said first and second regions for a period which is long enough to assure that conduction is sufficient to discharge an electrostatic discharge, and
   wherein said second inductor has an inductance which is large enough to delay an increase in bypass current around the p-n junction between said third and fourth regions for a period which is long enough to assure that conduction is sufficient to discharge an electrostatic discharge.

3. A voltage clamp according to claim 1 wherein said first inductor and said second inductor have inductance values between about 20 nH to 50 nH.

4. A voltage clamp according to claim 1 wherein one of said first and second inductors has an inductance between about 20 nH to 50 nH.

5. A voltage clamp according to claim 1 wherein said first and third region are of N-type conductivity and wherein said second and fourth regions are of P-type conductivity, said voltage clamp further comprising:
   a first diode, having an anode and a cathode, electrically connected between an I/O node and said first region, the anode of said first diode being connected to said first region and the cathode of said first diode being connected to the I/O node; and
   a second diode, having an anode and a cathode, electrically connected between the I/O node and said fourth region, the anode of said second diode being connected to said I/O node and the cathode of said second diode being connected to said fourth region.

6. A voltage clamp according to claim 1 and further comprising:
   a substrate resistor electrically connected in parallel to one of said first inductor and said second inductor, the resistance of said substrate resistor being high enough to allow the voltage clamp to latch.

7. A voltage clamp according to claim 6 wherein said substrate resistor has a resistance value of at least about 10 ohms.

8. An SCR voltage clamp comprising:
   first, second, third, and fourth regions of semiconducting material, said first and third regions being of a first type conductivity and said second and fourth regions being of a second type conductivity, such that p-n junctions are formed between said first and second regions, said second and third regions, and said third and fourth regions;
   a first inductor electrically connecting said first and second regions, said first inductor having an inductance which is large enough to delay an increase in bypass current around the p-n junction between said first and second regions for a period which is long enough to assure that conduction is sufficient to discharge an electrostatic discharge;
   a second inductor electrically connecting said third and fourth regions, said second inductor having an inductance which is large enough to delay an increase in bypass current around the p-n junction between said third and fourth regions for a period which is long enough to assure that conduction is sufficient to discharge an electrostatic discharge;

a first reverse bias diode electrically connected between an I/O node and said first region;

a second reverse bias diode electrically connected between the I/O node and said fourth region;

a substrate resistor electrically connected in parallel to one of said first inductor and said second inductor, the resistance of said substrate resistor being high enough to allow the voltage clamp to latch.

9. A voltage clamp according to claim 8 wherein said first and third regions are of N-type conductivity and wherein said second and third regions are of P-type conductivity, and wherein said first reverse bias diode comprises a first diode, having an anode and a cathode, electrically connected between the I/O node and said first region, the anode of said first diode being connected to said first region and the cathode of said first diode being connected to the I/O node, and wherein said second reverse bias diode comprises a second diode, having an anode and a cathode, electrically connected between said I/O node and said fourth region, the anode of said second diode being connected to the I/O node and the cathode of said second diode being connected to said fourth region.

10. A voltage clamp according to claim 8 wherein said first inductor and said second inductor have inductance values between about 20 nH to 50 nH.

11. A voltage clamp according to claim 8 wherein said substrate resistor has a resistance value of at least about 10 ohms.

12. An integrated circuit with an SCR transient clamp comprising:

an integrated circuit having first and second potential inputs and a plurality of I/O nodes;

an SCR having first, second, third, and fourth regions of semiconducting material, said first and third regions being of a first type conductivity and said second and fourth regions being of a second type conductivity, such that p-n junctions are formed between said first and second regions, said second and third regions, and said third and fourth regions;

a first inductor electrically connecting said first and second regions, said first inductor having an inductance which is large enough to delay an increase in bypass current around the p-n junction between said first and second regions for a period which is long enough to assure that conduction is sufficient to discharge an electrostatic discharge;

a second inductor electrically connecting said third and fourth regions, said second inductor having an inductance which is large enough to delay an increase in bypass current around the p-n junction between said third and fourth regions for a period which is long enough to assure that conduction is sufficient to discharge an electrostatic discharge;

a first reverse bias diode electrically connected between at lease one I/O node and said first region;

a second reverse bias diode electrically connected between said at least one I/O node and said fourth region; and a substrate resistor electrically connected in parallel to one of said first inductor and said second inductor, the resistance of said substrate resistor being high enough to allow the voltage clamp to latch.

13. A voltage clamp according to claim 12 and further comprising:

a third reverse bias diode electrically connected between said first potential input and said first region;

a fourth reverse bias diode electrically connected between said first potential input and said fourth region;

a fifth reverse bias diode electrically connected between said second potential input and said first region; and a sixth reverse bias diode electrically connected between said second potential input and said fourth region, such that said plurality of I/O nodes can operate at voltages above and below any supply voltages electrically connected to said first and second potential inputs but which are limited by breakdown voltages of said third, fourth, fifth, and sixth reverse bias diodes.

14. A voltage clamp according to claim 12 wherein said first inductor and said second inductor have inductance values between about 20 nH to 50 nH.

15. A voltage clamp according to claim 12 wherein said substrate resistor has a resistance value of at least about 10 ohms.

* * * * *